United States Patent [19]
Hee et al.

[11] Patent Number: 5,651,036
[45] Date of Patent: Jul. 22, 1997

[54] THIRD HARMONIC SUPPRESSION SCHEME FOR A WAVE USED IN A PHASE-TO-FREQUENCY CONVERTER

[75] Inventors: Wong Hee, San Jose; Gabriel Li, San Francisco, both of Calif.

[73] Assignee: National Semiconductor Corporation, Santa Clara, Calif.

[21] Appl. No.: 644,036

[22] Filed: May 9, 1996

[51] Int. Cl.$^6$ ............................................ H04L 7/00
[52] U.S. Cl. ...................... 375/374; 375/376; 327/164
[58] Field of Search .................... 375/371, 373, 375/374, 375, 376, 344, 324, 327; 327/141, 148, 160, 164, 178, 105; 455/76

[56] References Cited

U.S. PATENT DOCUMENTS

| | | |
|---|---|---|
| 4,208,674 | 6/1980 | Kuniyoshi et al. ...................... 386/19 |
| 5,224,125 | 6/1993 | Wong et al. ........................... 375/82 |
| 5,477,181 | 12/1995 | Li et al. ................................. 327/258 |

*Primary Examiner*—Tesfaldet Bocure
*Attorney, Agent, or Firm*—Limbach & Limbach L.L.P.

[57] ABSTRACT

A phase-to-frequency converter uses a triangular waveform synthesizer to generate a triangular wave using both PDM and a DC modulation scheme. A 4–bit PDM and associated logic generates the PDM output waveform with polarity information and two switching waveforms that encode the DC level information to provide a resultant sum. The resulting waveform, after filtering, is the multiple phases of the triangular waveform. The generated multiple phases of the triangular wave are then modified by reducing the ramp rate at appropriate points to suppress the third harmonic and its multiples. The ramp rate is proportional to the pulse density output of the Pulse Density Modulator. In one embodiment, the rate of the PDM output is reduced by one half during appropriate periods by gating the output by its clock, thereby reducing its density by one half during those periods.

3 Claims, 9 Drawing Sheets

THIRD HARMONIC SUPPRESSION SCHEME FOR A WAVE USED IN A PHASE-TO-FREQUENCY CONVERTER

RELATED APPLICATION

This application is related to commonly-assigned application Ser. No. 08/644,035, filed on May 9, 1996, 1996 (Docket No. NSC1-59900), titled "MULTI-PHASE TRIANGULAR WAVE SYNTHESIZER FOR PHASE-TO-FREQUENCY CONVERTER", which application is hereby incorporated by reference in its entirety to provide additional background information regarding the present invention.

BACKGROUND OF THE INVENTION

1. Field of the Invention

The present invention relates to very high frequency phase locked loops (PLLs) and, in particular, to a method of modifying the triangular waves used to drive the PLL's frequency controlled oscillator by reducing the triangular wave ramp rate at appropriate positions, thereby suppressing the third harmonic and its multiples.

2. Discussion of the Related Art

Commonly-assigned U.S. Pat. No. 5,224,125, issued Jun. 29, 1993, to Hee Wong et al., discloses a signed phase-to-frequency (P-to-F) converter for use in a very high frequency PLL. Referring to FIG. 1, the quasi-digital, high frequency PLL 10 disclosed in the '125 patent includes a phase detector 12, a signal P-to-F converter 14, a 3-phase ring oscillator 16 and a frequency controlled oscillator (FCO) 18. FCO 18 and P-to-F converter 14 allow the use of a clock frequency which is no higher than the generating frequency of the PLL 10 to achieve acceptable phase resolution.

The P-to-F converter 14 converts the phase error information generated by the phase detector 12, which is in the form of UP, DOWN and HOLD signals, to multi-phase analog waveforms (PHASE 1, PHASE 2, PHASE 3) that can be used to drive the FCO 18. The output frequency of the P-to-F converter 14 determines the locking range of the PLL 10. The phase error direction, either plus or minus, is represented by the phase relationship, either leading or lagging, of the multi-phase outputs of the P-to-F converter 14, which the FCO 18 interprets as either an increase, a decrease or no change in the operating frequency.

As shown in FIG. 2, the P-to-F converter 14 disclosed in the '125 patent includes a counting circuit 21 that converts the plus/minus phase error signal UD_PI provided by the phase detector 12 to a 7-bit count signal. The three most significant bits (MSB) of the count signal, i.e., the HI_CNT signal, are used by a 3-phase waveform generator 25 to generate a 3-phase sawtooth pattern. The four least significant bits (LSB) of the count signal, i.e., the LO_CNT signal, are utilized by a pulse density modulation (PDM) circuit 28 to generate a signal that indicates the binary weight of the LSB part of the count. The output of the LSB PDM circuit 28 and the 3-phase sawtooth pattern are applied to three MSB PDM circuits 36, 38, 40. The three carry outputs of the MSB PDM circuits 36, 38, 40 are the digital outputs of the P-to-F converter 14. Following buffering, the three digital outputs of the P-to-F converter 14 are converted to analog signals (PHASE 1, PHASE 2, PHASE 3) by RC filters. The plus/minus phase is indicated by the leading/lagging phase relationship among the output waveforms.

A problem associated with the solution disclosed in the '125 patent is real time delay. That is, since generation of the 3-phase triangular waveform is within the PLL tracking loop, the time required for synthesis directly impacts upon the response time of the phase error correction, which increases the phase jitter of the recovered clock. (U.S. Pat. No. 5,224,125 is hereby incorporated by reference in its entirety.)

Commonly-assigned U.S. patent application Ser. No. 08/644,035 (Docket No. NSC1-59900), provides an improvement over the PLL system disclosed in the '125 patent.

Application Ser. No. 08/644,035 discloses a triangular waveform synthesizer for a phase-to-frequency converter that generates a multi-phase triangular waveform using both Pulse Density Modulation (PDM) and a DC modulation scheme. To minimize both delay and logic, while continuing to provide reasonable resolution, a 4-bit PDM and associated logic generates the PDM output waveform with polarity information and two switching waveforms that encode the DC level information to provide a resultant sum. The resulting waveform, after filtering, is the triangular waveform. Since the switching and adding of the DC levels occur in real time, the actual delay for the resultant triangular wave is only that of the 4-bit PDM.

While the invention disclosed in Application Docket No. NSC1-59900 improves upon the commercially successful system disclosed in the '125 patent, there is always room for further improvement. Both systems take advantage of Pulse Density Modulation techniques. The key advantage of the system disclosed in Application Docket No. NSC1-59900 over the system disclosed in the '125 patent is its simplicity and short real time delay, which, as stated above, is a major factor in reducing the output jitter of the PLL. FIGS. 3 and 4 show the timing waveforms of the 3-phase triangular waves generated by the systems of the '125 patent and application Ser. No. 08/644,035, respectively. FIG. 5 shows the spectrum analyzer output of the triangular wave; the third harmonic is at 19 db below its fundamental harmonic and at the −28.6 db display line.

A problem with both of these systems, however, is the relatively high energy of the third and higher harmonics of the triangular wave.

SUMMARY OF THE INVENTION

The present invention provides a phase-to-frequency converter that utilizes a triangular waveform synthesizer to generate a multi-phase triangular waveform using both Pulse Density Modulation (PDM) and a DC modulation scheme. A PDM and associated logic generates both the multi-phase PDM output waveform with polarity information and two switching waveforms that encode the DC level information to provide a resultant sum. The resulting waveform, after filtering, is the triangular waveform. In accordance with the invention, each triangular waveform is then modified by reducing the ramp rate at appropriate positions to suppress the third harmonic and its multiples. The ramp rate is proportional to the output of the Pulse Density Modulator. In the disclosed embodiment, the rate of the PDM output is reduced by gating the output by the wave synthesizer clock signal, thereby reducing the density of the output by one half in the appropriate positions.

These and other features and advantages of the present invention will be better understood and appreciated upon consideration of the following detailed description and the accompanying drawings which set forth an illustrative embodiment in which the principles of the invention are utilized.

DETAILED DESCRIPTION OF THE INVENTION

Figure 6:
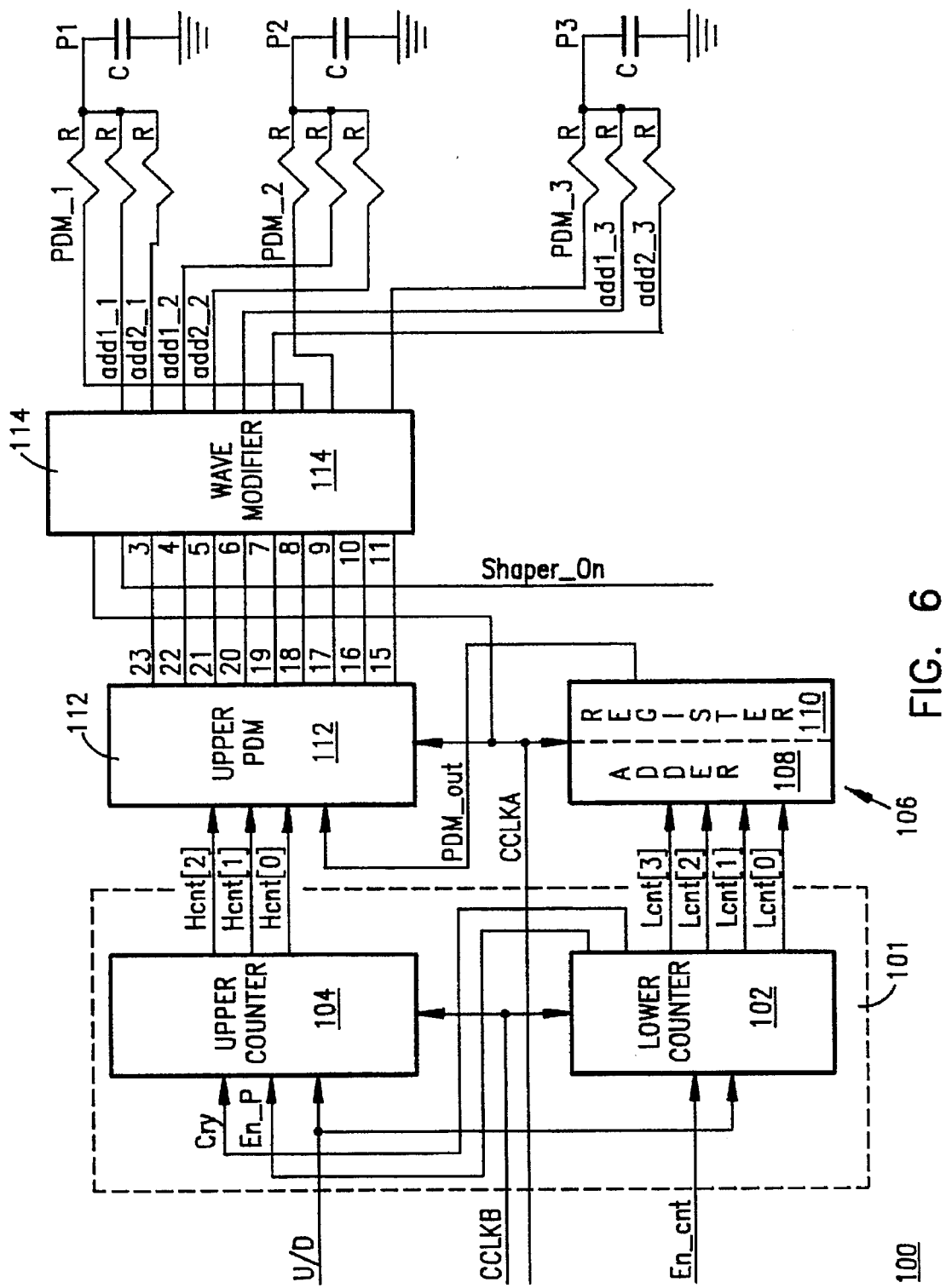
FIG. 6 is a block diagram illustrating a multi-phase waveform synthesizer with third harmonic suppression in accordance with the present invention.

FIG. 6 shows a block diagram of a phase-to-frequency (P-to-F) converter circuit 100 that includes a 3-phase triangular waveform synthesizer with third harmonic suppression in accordance with the present invention. The P-to-F converter circuit 100 can be used to replace the P-to-F converter 14 in the FIG. 1 PLL circuit 10 described in the '125 Wong et al. patent.

Figure 1:
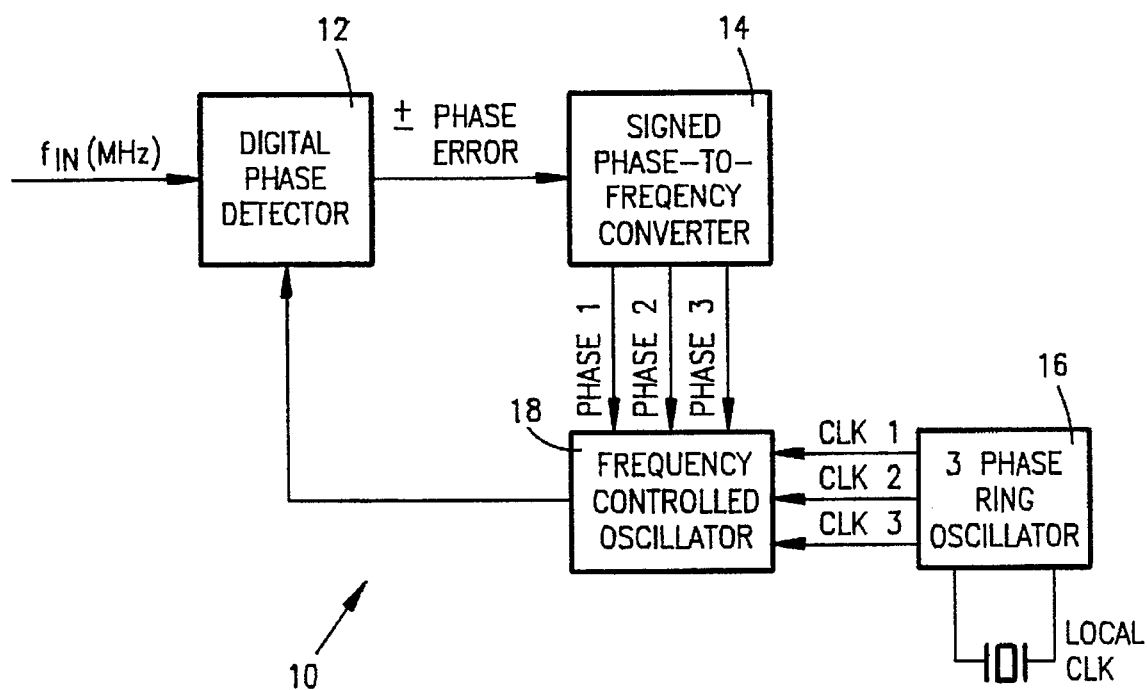
FIG. 1 is a block diagram illustrating a known digital phase locked loop.
Figure 2:
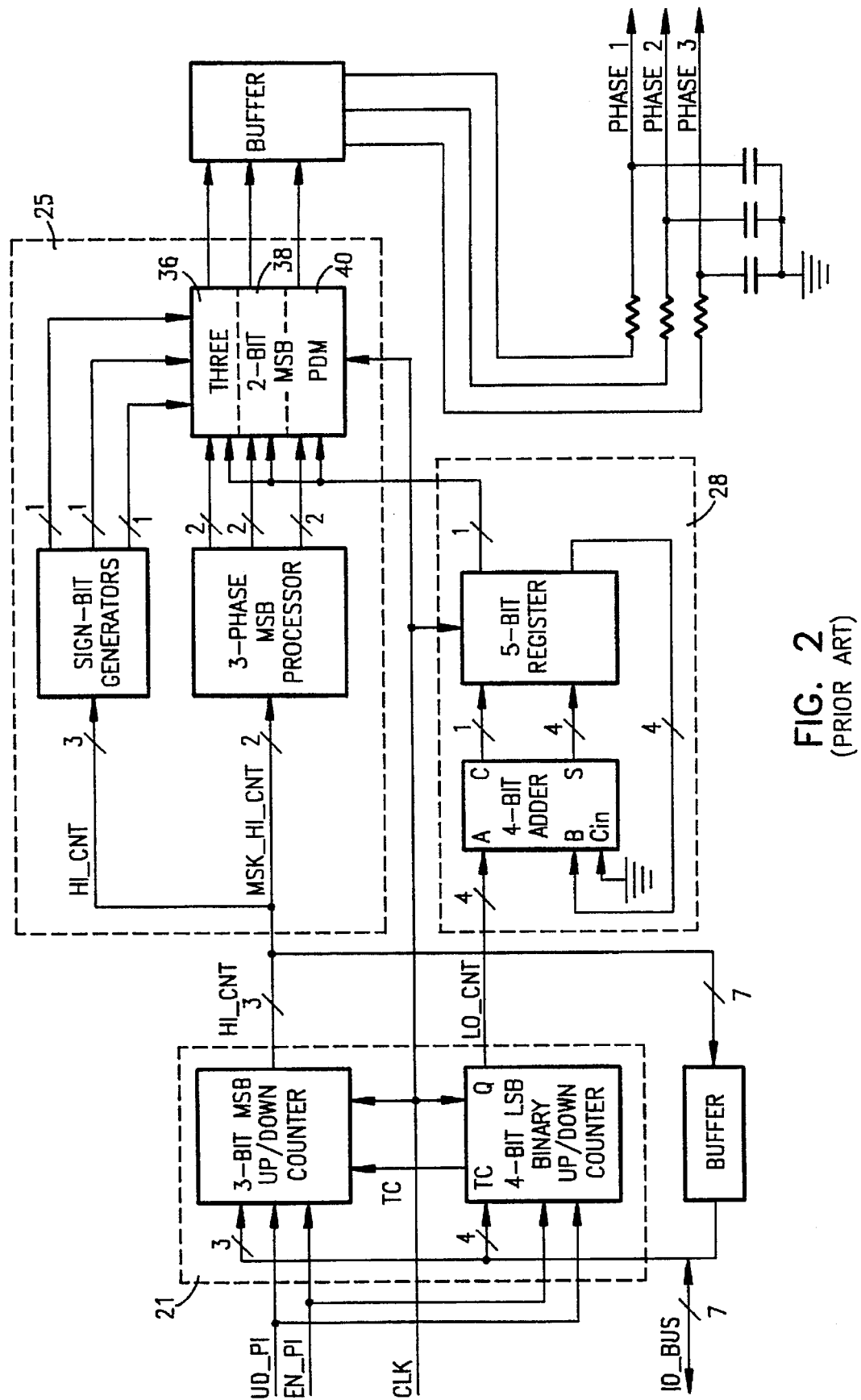
FIG. 2 is a block diagram illustrating a known phase-to-frequency converter that may be utilized in the FIG. 1 PLL.
Figure 3:
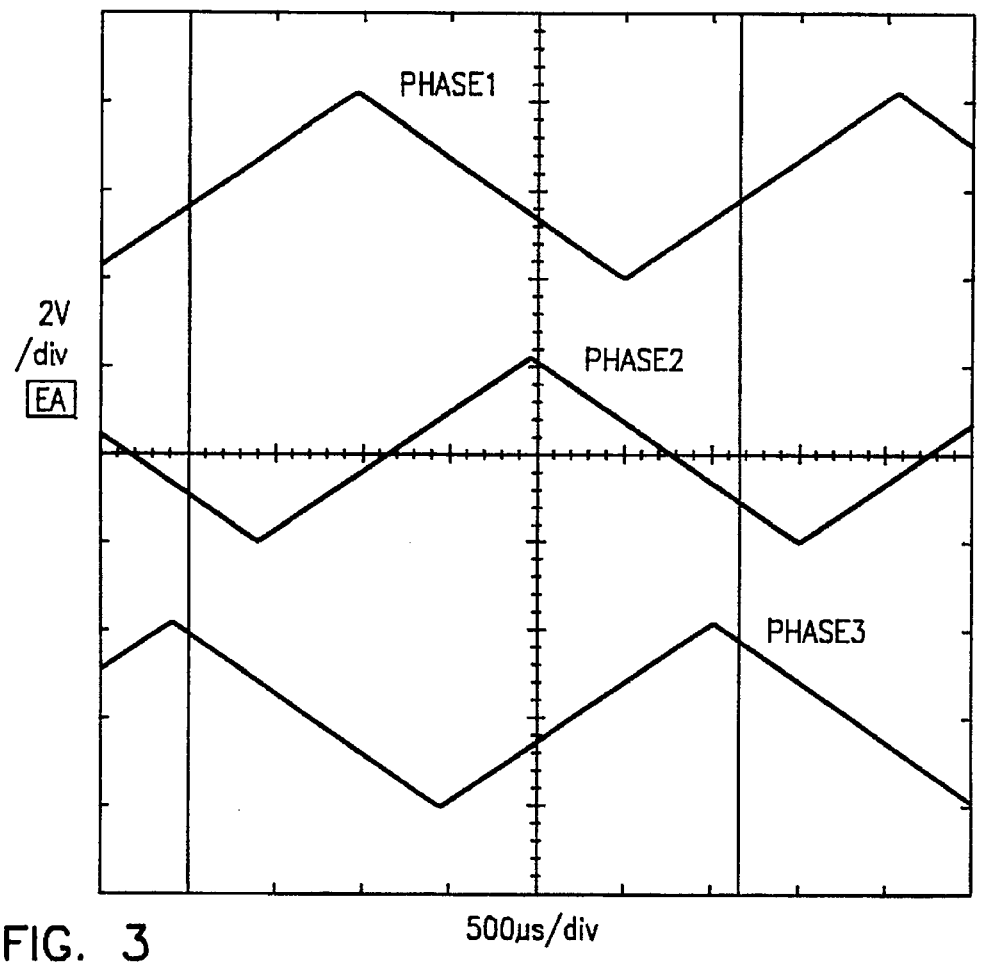
FIG. 3 shows the timing of the 3-phase triangular waves generated by the phase-to-frequency converter disclosed in U.S. Pat. No. 5,224,125.
Figure 4:
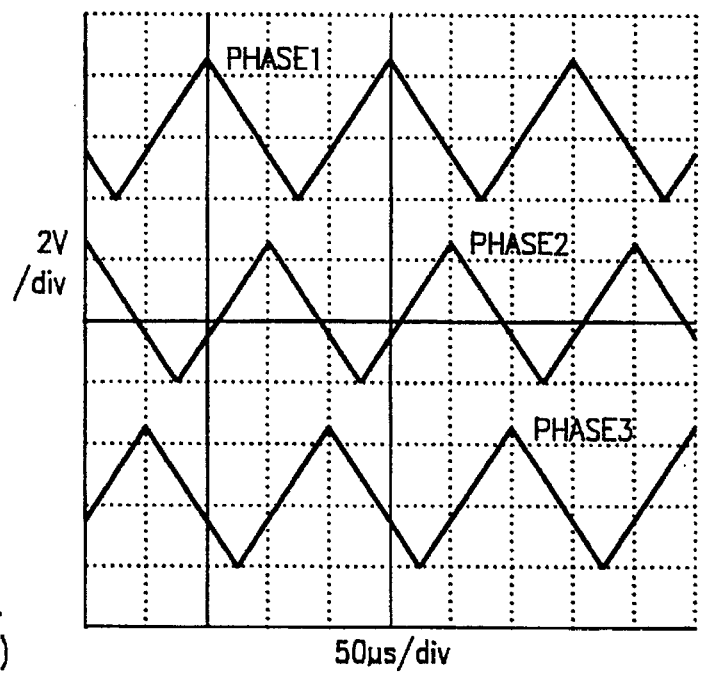
FIG. 4 shows the timing of the 3-phase triangular waves generated by the wave synthesizer disclosed in application Docket No. Ser. No. 08/644,035.
Figure 5:
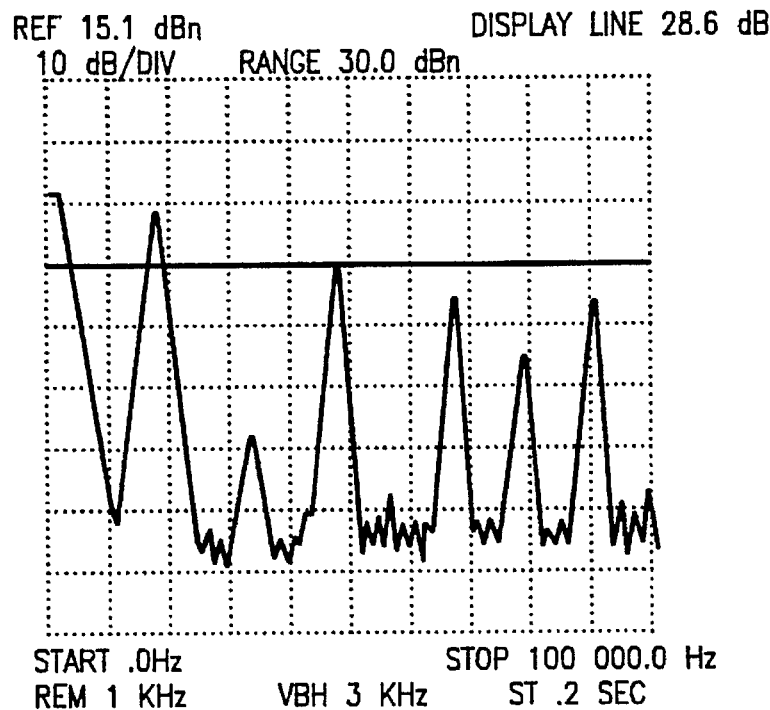
FIG. 5 shows the spectrum analyzer output of the FIG. 4 waves.

P-to-F converter 100 receives two signals, an up/down signal U/D that represents the ±-phase error quantities generated by the digital phase detector 12 and a count enable signal En_cnt. Input signal U/D controls the count direction of up/down counter 101, causing the counter 101 to count up when U/D=logic "1" and to count down when U/D=logic "0". The count enable signal En_cnt enables the counter 101 when in logic "1" and stops the counter 101 when in logic "0". Clock signals CCLKA and CCLKB are equivalent and are both derived from the output of the 3-phase ring oscillator 16 (FIG. 1).

Counter 101 may be a conventional up/down counter viewed as a lower 4-bit LSB binary up/down counter 102 and an upper 3-bit MSB binary up/down counter 104. The lower 4-bit counter 102 receives both the phase error signal U/D and the enable signal En_cnt. Thus, lower counter 102 stops if En_cnt=0. The carry output signal Cry of the 4-bit lower counter 102, together with a carry enable signal En_P, is fed into the upper 3-bit counter 104 that counts from 0 to 5. The lower counter 102 generates a four LSB output (Lcnt[0]–[3]) that is provided to a lower 4-bit PDM circuit 106 which operates in a manner similar to that described in the '125 patent. Lower PDM circuit 106 comprises a 4-bit adder 108 and a 5-bit register 110; the output of the 4-bit adder 108 is connected to the input of the 5-bit register 110. The lower PDM circuit 106 adds the previous contents of the register 110 to the current value of the LSB output (Lcnt[0]–[3]) of the lower counter 102. The operation is repetitious at every cycle of the CCLKA clock. The carry output signal PDM_out of the lower PDM circuit 106 becomes the sawtooth wave. Simply by inverting the PDM_out signal digitally causes a 180° phase shift. Hence, a triangular wave is formed by inverting the PDM_out signal every other full period of the clock signal.

Figure 7:
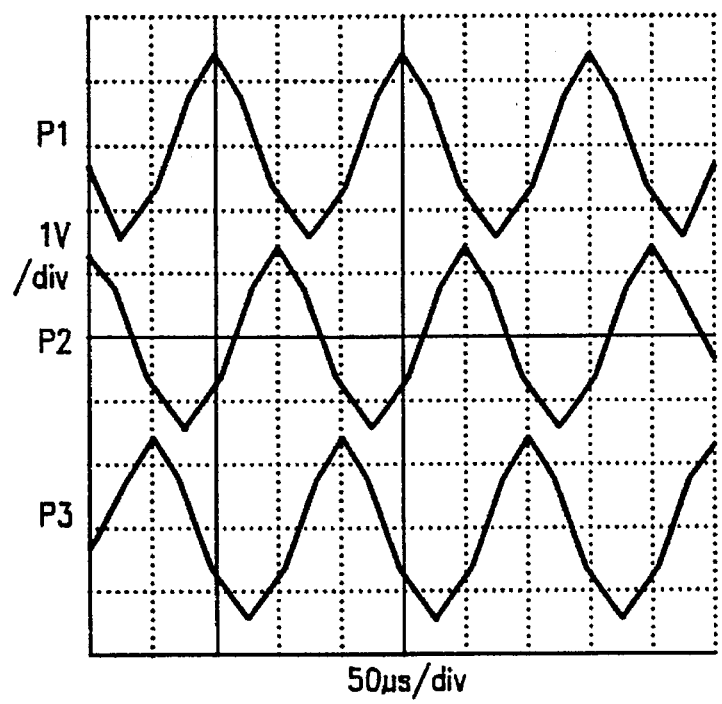
FIG. 7 shows the modified phases of the triangular waves generated by the FIG. 6 wave synthesizer.

The upper counter 104 generates a three MSB output (Hcnt[0]–[2]) based upon the phase error signal U/D. The three bits (Hcnt[0]–[2]) from the upper counter 104 and the carry output signal PDM_out of the lower PDM circuit 106 are provided to an upper PDM circuit 112 that generates three outputs per each of the three phases P1, P2, P3: add1_n, add2_n and PDM_n (where n=1,2,3), as shown in FIG. 6. FIG. 7 is the scope waveform of the three phases P1, P2, P3 of the triangular wave which have been modified in accordance with the invention to provide third harmonic suppression.

A description of the logic implementation of the upper PDM circuit 112 is provided below. For an actual implementation, reference is made to the gal equations provided in Appendix A at the end of this detailed description (Appendix A is an integral part of this patent specification).

The core of the upper PDM circuit logic 112 is a decoder that decodes the count from count 0 to count 5 of the upper counter 104. The logic equations of the three outputs of the upper PDM circuit 112 are as follows:

```
add1_1 = ((count>=1)&&(count<=4)) ?(1):(0)
add2_1 = ((count>=2)&&(count<=3)) ?(1):(0)
PDM_1 = invt*PDM_out
invt   = ((count>=3)&&(count<=5)) ?(1):(0)
```

Figure 8:
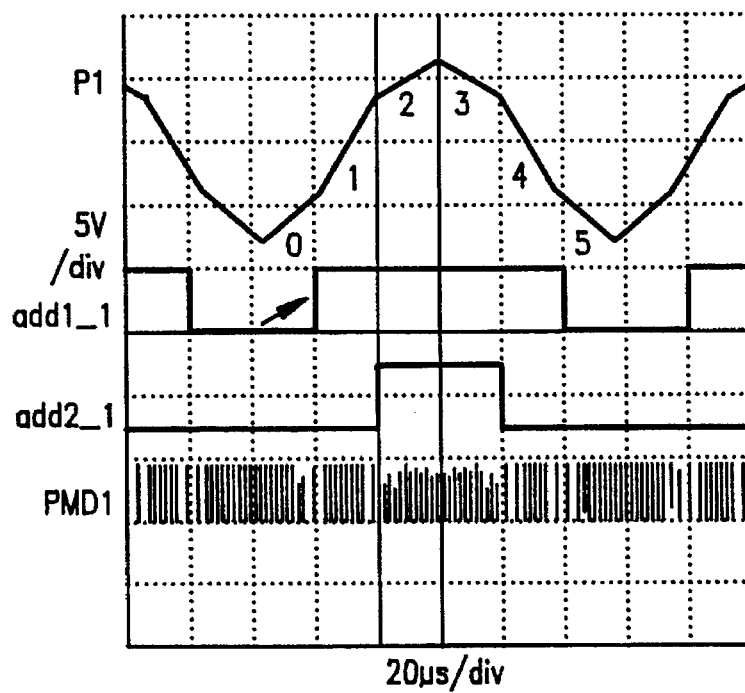
FIG. 8 shows only one phase of the modified triangular wave.

FIG. 8 shows the three necessary outputs to create phase 1 (P1) of the modified triangular wave. The signal add1_1 is asserted during counts 1, 2, 3, and 4. The signal add2_1 is asserted during counts 2 and 3. PDM_1 is the PDM_out during count 0, 1, and 2; during count 3, 4, and 5, PDM_out is inverted.

To generate phase 2 (P2) of the triangular wave, the counter value must be offset by 2, which translates to a 120 degree phase shift. Similarly, offsetting the counter value by 4 provides a 240 degree phase shift for the phase 3 (P3) of the triangular wave.

Resistors R in the FIG. 6 circuit 100 are all equally weighted.

The HDL description of the design and the actual gal equations are attached as part of Appendix A.

As stated above, FIG. 7 shows the modified phases of the triangular waves. To simplify the description of the design, only one phase of the triangular wave and the appropriate signals are displayed in FIG. 8. With the help of the add1_1 and add2_1 signals, and the slope inversion, each triangular waveform can be divided into six segments or states (0,1, 2,3,4,5). During states 0 and 5, both the add1_1 and the add2_1 signals are logic low. During states 2 and 3, both the add1_1 and the add2_1 signals are logic high. During these states, i.e., states 0, 2, 3, 5, the clock that sampled the PDM is gated with the PDM output to reduce its ramp rate, thereby reducing the density of the output by one half in the appropriate positions.

More specifically, as shown in FIG. 8 during count 0, both the add1_1 and the add2_1 switching outputs are de-asserted and the P1 phase output reflects the PDM_1 waveform. During count 1, switching output add1__1 is asserted, but switching output add2__1 remains de-asserted; with no harmonic suppression during count 1, the DC component of the waveform is added to the full PDM__1 signal. During count 2, both the add1__1 and the add2__1 switching outputs are asserted and, with the gating clock signal providing harmonic suppression, 2× the DC component is added to gated PDM__1. The reverse sequence for the switching outputs add1__1 and add2__1 occurs during counts 3, 4 and 5, but with PDM__1 inverted to provide the "downslope" of the FIG. 8 triangular waveform for phase P1.

Figure 10:
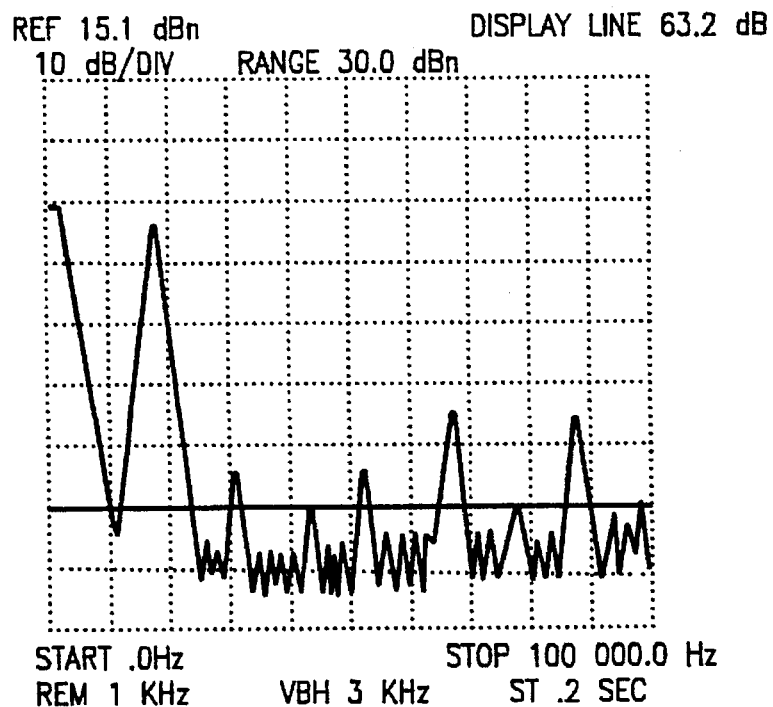
FIG. 10 shows the spectrum analyzer output of the modified triangular wave.
Figure 9:
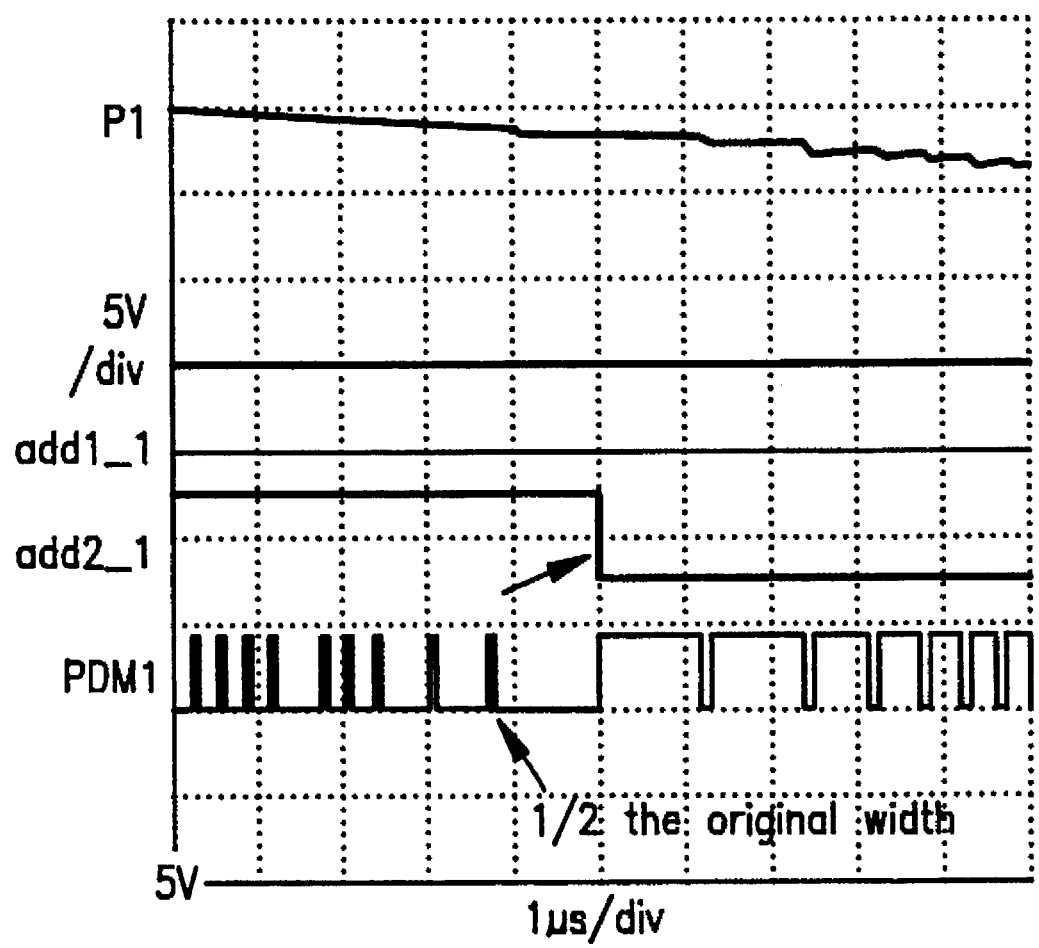
FIG. 9 shows an enlarged waveform during states 3 and 4 of the FIG. 8 waveform.
Figure 11:
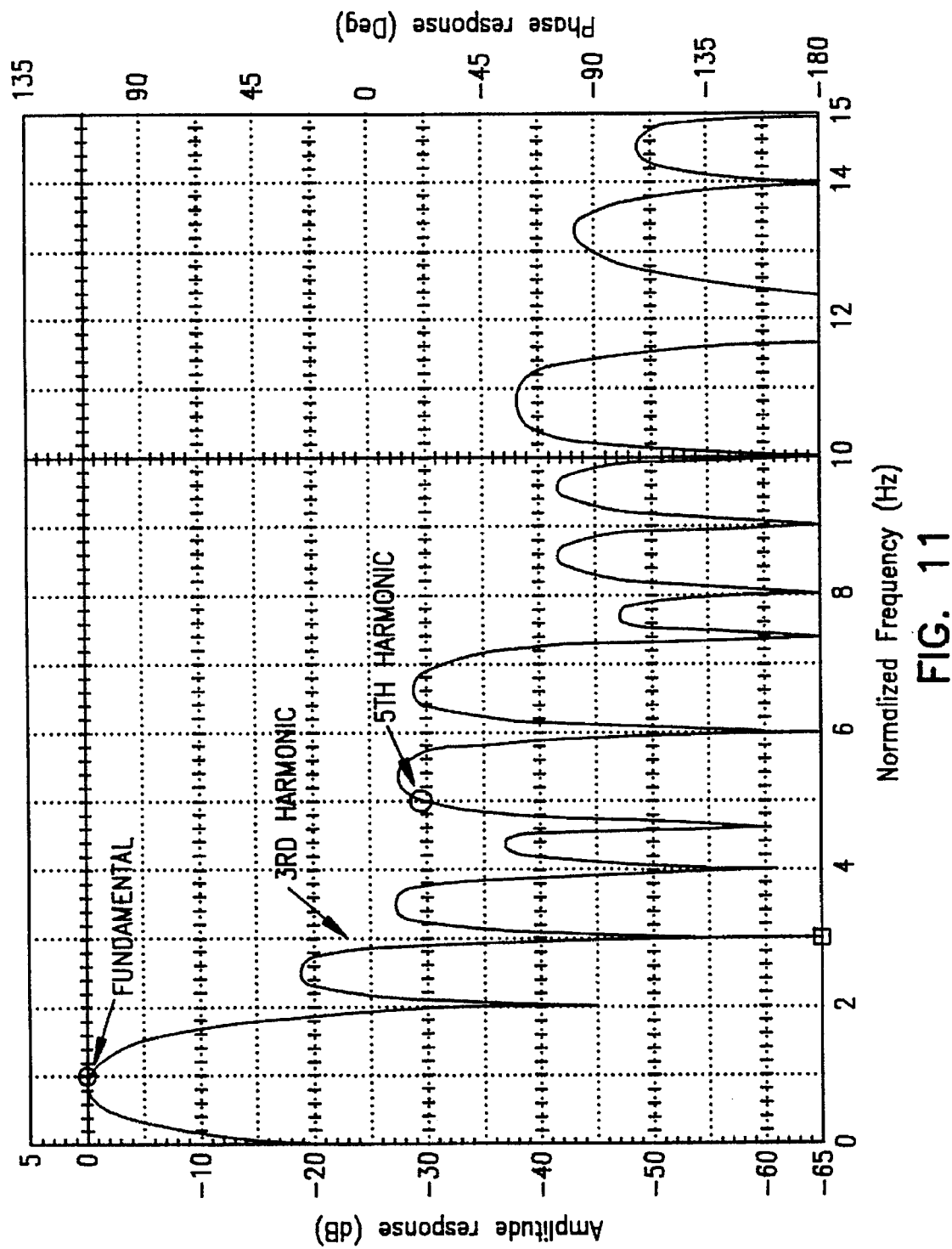
FIG. 11 shows the output of the Fourier Transform of the modified triangular wave.

FIG. 9 shows the enlarged waveforms during state 3 and 4. Notice the half pulse width during state 3. This is a direct result of the HDL code:

If((shaper__on)&&(shaper__clock) if(add2__1)PDM1=0;

FIG. 10 displays the spectrum analyzer output of the modified triangular wave. The third harmonics and its multiples are reduced to −63.2 db of the display line. A Fourier Transformation program has been developed in order to analyze both the triangular and modified triangular waves. FIG. 11 shows the output of the Fourier Transform of the modified wave. Notice the 3rd harmonic and its multiples, i.e. the 6th, 9th, 12th, and 15th harmonics, are all below 65 db from its fundament.

Figure 12:
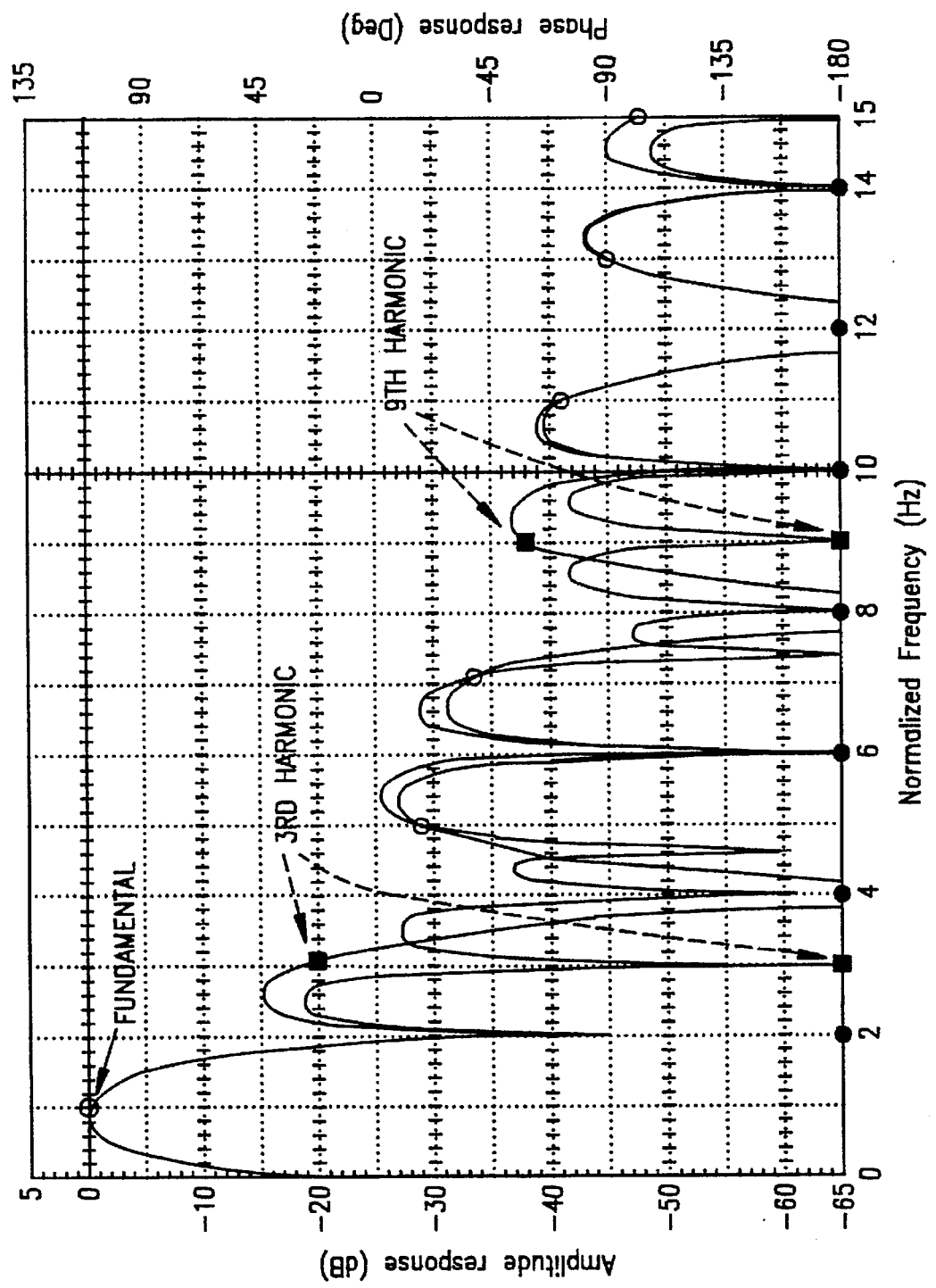
FIG. 12 shows the result of superimposing a triangular wave over that of the modified wave.

FIG. 12 is a result of superimposing the result of a triangular wave over that of the modified one. Notice the third harmonic of the triangular wave is 19 db below its fundament.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A phase-to-frequency (P-to-F) converter that converts a digital phase error signal that indicates positive and negative phase errors into a plurality of phase-separated triangular waveforms, the P-to-F converter comprising:

an up/down counter that counts the positive and negative phase errors and generates a multi-bit, parallel digital counter output signal that indicates a cumulative current value of the phase errors, the counter output signal including a least significant bit (LSB) portion and a most significant bit (MSB) portion;

a pulse density modulator (PDM) that converts the LSB portion of the counter output signal to a corresponding serial digital PDM signal;

wave synthesizer circuitry that combines the MSB portion of the counter output signal and the PDM signal to provide a plurality of DC-modulated, phase-separated triangular waveforms; and a third harmonic suppressor connected to the wave synthesizer circuitry for suppressing the third harmonic of the DC-modulated, phase-separated waveforms to provide modulated output signals.

2. A P-to-F converter as in claim 1 and wherein the wave synthesizer circuitry comprises a multi-phase triangular wave synthesizer that is driven by periodic counts of a clock signal and that responds to the MSB portion of the counter output signal and the PDM signal to provide, for each of the plurality of phase-separated output signals of the wave synthesizer, (i) a PDM output waveform with polarity information, (ii) a first switching signal that modulates the PDM output waveform on first specified counts of the clock signal, and (iii) a second switching signal that modulates the PDM output waveform on second specified counts of the clock signal.

3. A P-to-F converter as in claim 2 wherein the PDM output waveform is gated with the clock signal during the first and second specified counts, thereby reducing the density of the PDM output waveform by one half during the first and second specified counts.

* * * * *